(12) United States Patent
Bae

(10) Patent No.: US 8,009,485 B2
(45) Date of Patent: *Aug. 30, 2011

(54) SEMICONDUCTOR MEMORY DEVICE

(75) Inventor: Ji-Hyae Bae, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 228 days.

This patent is subject to a terminal disclaimer.

(21) Appl. No.: 12/005,932

(22) Filed: Dec. 28, 2007

(65) Prior Publication Data

US 2009/0116311 A1 May 7, 2009

(30) Foreign Application Priority Data

Nov. 2, 2007 (KR) .................. 10-2007-0111612

(51) Int. Cl.
G11C 7/00 (2006.01)
G11C 8/00 (2006.01)

(52) U.S. Cl. ......... 365/189.05; 365/189.08; 365/189.17; 365/230.06

(58) Field of Classification Search ............. 365/189.08, 365/189.02, 189.05, 230.06, 233.1, 233.16, 365/233.17, 230.02, 230.08, 191, 189.17
See application file for complete search history.

(56) References Cited

U.S. PATENT DOCUMENTS 7,692,982 B2 * 4/2010 Yoon ................. 365/191
2008/0225603 A1 * 9/2008 Hein

FOREIGN PATENT DOCUMENTS

KR 100557221 2/2006
KR 10-2006-0026661 A 3/2006

OTHER PUBLICATIONS

"Qimonda GDDR5-Whitepaper", Aug. 2007, 10 pages.

* cited by examiner

*Primary Examiner* — Trong Phan
(74) *Attorney, Agent, or Firm* — Blakely, Sokoloff, Taylor & Zafman

(57) ABSTRACT

A semiconductor memory device includes training drivers configured to transmit one of data and a predetermined training data pattern from a first data lines to a second data lines in response to a training control signal which is produced by decoding a read training command; and the second data lines configured to transmit an output of the training drivers. The semiconductor memory device according to the present invention can exactly measure a delay time, which is changed according to the surrounding environments between a semiconductor memory device and a data processing unit, through a data training and operation timing can be also adjusted based on the measured delay time.

17 Claims, 2 Drawing Sheets

SEMICONDUCTOR MEMORY DEVICE

CROSS-REFERENCES TO RELATED APPLICATION

The present application claims priority to Korean application number 10-2007-0111612, filed on Nov. 2, 2007, which is incorporated by reference in its entirety.

BACKGROUND OF THE INVENTION

The present invention relates to a semiconductor memory device and, more particularly, to a semiconductor memory device capable of transmitting data at read and write operations at a high speed.

Generally, in a system having a plurality of semiconductor devices, a semiconductor memory device is provided to store data. When data are requested from a data processing apparatus such as a CPU, the semiconductor memory device outputs the data which are correspondent to address signals from an external circuit or stores the data to memory cells which are correspondent to address signals.

As the system which is implemented by a plurality of the semiconductor devices increases its operating speed and the semiconductor integration has been gradually developed, the semiconductor memory device has increased its demand for a high-speed data processing mechanism. In order that the semiconductor memory device stably and quickly operates, various circuits within the semiconductor memory device also operate in a high speed and the signal transmission between the circuits is also performed at a high speed.

Actually, in the semiconductor memory device, the data processing can be delayed by a plurality of control circuits to read out the data from a unit cell and transmit input data from the external circuit to the unit cell and a transmission line and a connecting apparatus to transfer the data. Also, a delay is caused when the data from the semiconductor memory device are transferred to an apparatus of the system to request the data. In the high-speed system, the delay time required to transfer the signal and data functions as a factor to deteriorate the system performance and reduce the reliability of the whole operation of the system. The delay caused on the data transmission path has a possibility of a change based on a given operating environment and this has a bad effect on the operation of the semiconductor memory device.

Generally, the more an output operation to output the data from a unit cell (read operation) is processed at a high speed after a command is inputted from an external circuit, the more the operating performance of the semiconductor memory device improves. In case of a semiconductor memory device for a graphic data process in which a large amount of data such as an image data are processed, the data output timing is used as an important factor to evaluate the memory device performance. Further, the stability of the system can be guaranteed when the output data from the semiconductor memory device are transmitted exactly to various data processing units.

FIG. 1 is a timing chart illustrating a read operation of a conventional semiconductor memory device. In FIG. 1, a data transmission is illustrated between a semiconductor memory device and a graphic processing unit (GPU) for the graphic data.

As shown in FIG. 1, a DDR (DOUBLE DATA RATE) semiconductor memory device (DDR SDRAM) outputs DRAM data in synchronization with a rising edge signal and a falling edge signal of a memory clock signal in a read operation which is requested from a graphic processing unit.

Also, the graphic processing unit receives the data in synchronization with the rising edge signal and the falling edge signal of a graphic clock signal. At this time, the graphic processing unit exactly receives the data (GPU DATA) when the rising and falling edges are positioned within a data valid window of the data outputted from DDR SDRAM.

A delay time of t2−t1 is caused by a physical phenomenon which exists on the data transmission between the semiconductor memory device and the graphic processing unit. Although the data are outputted in synchronization with the edges of the clock signal in the semiconductor memory device, the graphic processing unit exactly transfers the transmitted data when the edges are positioned within the data valid window, preferably in the middle of the data valid window. Accordingly, a phase difference of 0.5*UI (UI is a data valid window) between the memory clock (DRAM clock) and the graphic clock (GPU clock) is adequate to meet the ideal condition and the data delay time can be considered to be approximately t2−t1+0.5*UI based on physical factors which exist between the semiconductor memory device and the graphic processing unit. As a result, as shown in FIG. 1, the operations of the semiconductor memory device and the graphic processing unit are carried out based on the different phase. The different clock operation between the semiconductor memory device and the graphic processing unit means that there is a presence of a mismatch between a data transmission clock and a data acknowledgement clock (i.e., data trigger signal).

To obtain a stable operation against this mismatch, the semiconductor memory device or the system having such a semiconductor memory device predetermines the delay time between the semiconductor memory device and the graphic processing unit. Accordingly, an additional clock signal such as a read strobe signal RDQS and a write strobe signal WDQS is employed or an additional specification, such as an output access time tAC, a data strobe signal output access time output tDQSCK or a data strobe signal to data output time tDQSQ, is employed in the semiconductor memory device.

However, since the specification of the semiconductor memory device is physically prescribed by a constant value between the semiconductor memory device and the graphic processing unit, it is difficult to guarantee a normal data transmission in the actually implemented system. Particularly, since the data are increased on a channel between the semiconductor memory device and the graphic processing unit in a high-speed system, the stable data transmission is much more difficult.

To overcome the above-mentioned problem, the recent semiconductor memory device and graphic processing unit are provided to cope with the high-speed data transmission through a data training. The data training is a technique to control a skew between the data by using a data pattern which is prescribed between a controller and the semiconductor memory device in order to stably transmit the data at the read and write operations. For instance, in the specification of DDRIII semiconductor memory device, a write leveling technique is employed to compensate for the time difference which is caused by a delay between a clock signal HCLK and a data strobe signal DQS. The data strobe signal is produced by programmable delay elements which can satisfy a timing requirement, including tDQSS, tDSS and tDSH of the semiconductor memory device, by compensating for the skew between the data strobe signal and the clock signal through the write leveling technique.

Graphic memory devices, which are recently introduced, are designed to transmit the data over 4 Gbps and the specification prescribes the data training in the graphic memory device in order to meet this high-speed operation.

SUMMARY OF THE INVENTION

The present invention is directed to providing a semiconductor memory device capable of performing a data training operation to improve the reliability of data transmission in a high speed. Particularly, according to the present invention, a semiconductor memory device includes a driver capable of selectively transmitting a predetermined data pattern, which is correspondent to a data output command for a read operation, with a small-sized chip and low-power consumption.

In the present invention, a data training technique is used for improving the reliability of data transmission in a high-speed semiconductor memory device. The data training is used for preventing an error which is caused by a delay time and this error is prevented by adjusting an operating clock signal of a graphic processing unit based on channel environments during the data transmission between the semiconductor memory device and the graphic processing unit. Particularly, in the present invention, the semiconductor memory device outputs a predetermined data pattern without operations of a control circuit and a register, by connecting drivers to data lines through which a memory controller outputs the training data pattern to an external circuit in response to a read command for a read operation.

According to the present invention, the integration is improved by minimizing the configuration of read leveling circuits because the data pattern for the read operation can be applied to the data lines with a minimum requirement in the circuit configuration. Also, the circuit design is easily modified for the training so that it can be widely applicable in a semiconductor memory device.

Also, the present invention can exactly measure a delay time, which is changed according to the surrounding environments between a semiconductor memory device and a data processing unit, though a data training and operation timing can be also adjusted based on the measured delay time. As a result, the data transmission is stably carried out in a high-speed system and the power consumption for the data training is reduced.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF SPECIFIC EMBODIMENTS

Hereinafter, the present invention will be described in detail through embodiments. The embodiments are just for exemplifying the present invention, and the scope of right to be protected of the present invention is not limited by them.

Figure 1:
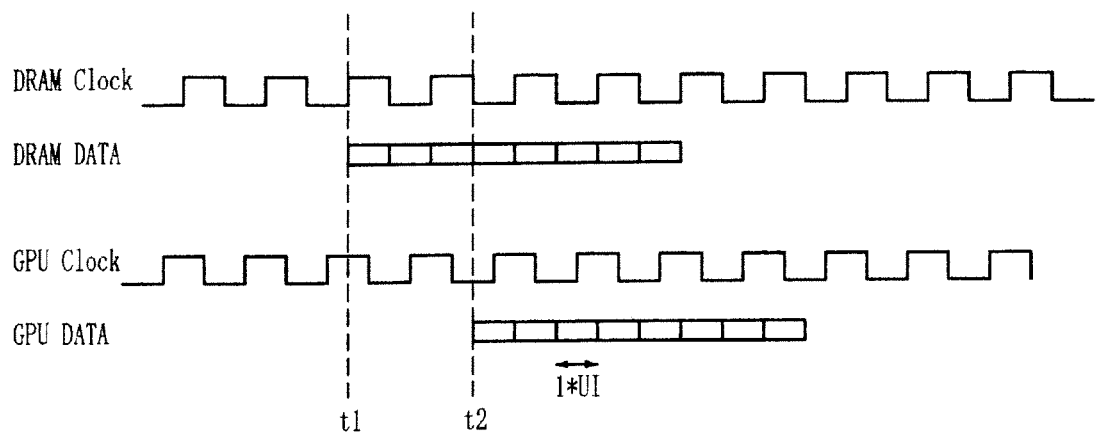
FIG. 1 is a timing chart illustrating a read operation of a conventional semiconductor memory device.
Figure 2:
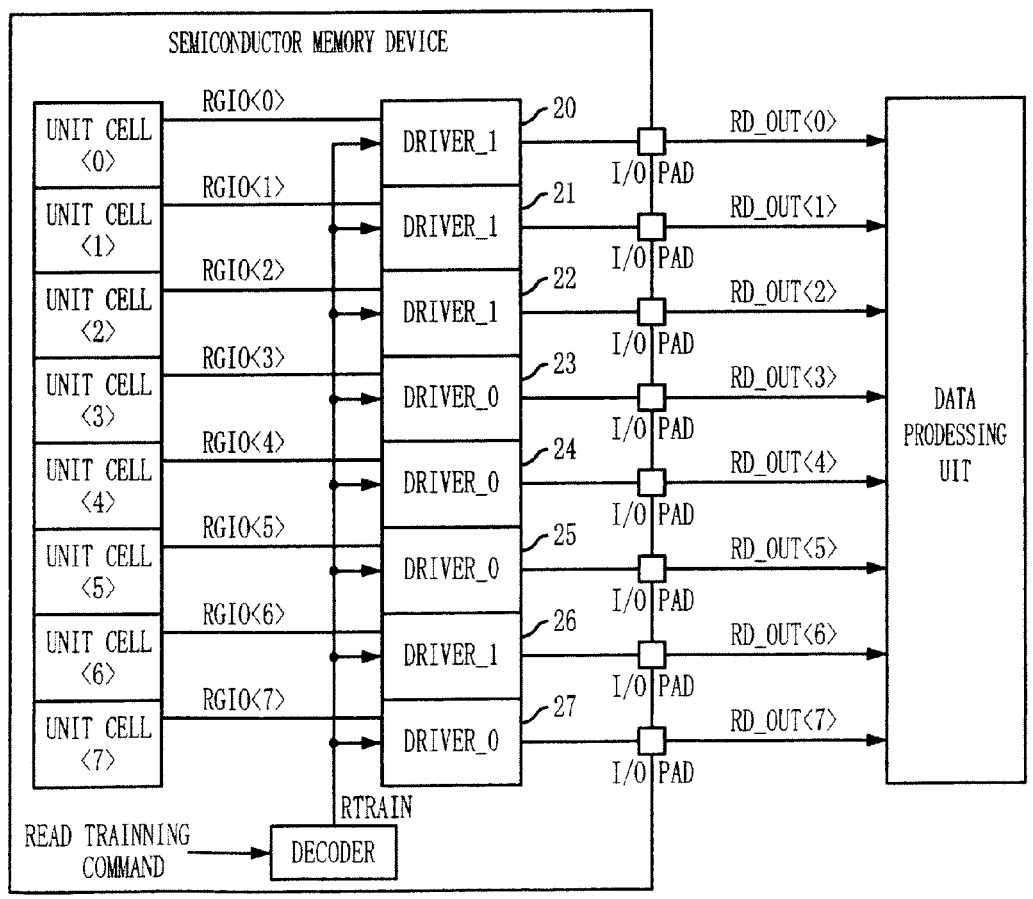
FIG. 2 is a schematic diagram illustrating a semiconductor memory device according to one embodiment of the present invention.

FIG. 2 is a schematic diagram illustrating a semiconductor memory device according to one embodiment of the present invention. The semiconductor memory device includes a plurality of data lines for transmitting one of data and a data training pattern and a plurality of training drivers 20 to 27 for transmitting a predetermined data training pattern to the data lines in response to a training control signal RTRAIN which is produced by decoding a read training command. The plurality of data lines are coupled to the plurality of training drivers 20 to 27, respectively. Particularly, in case that the data lines are global data lines in the semiconductor memory device, the power consumption can be minimized by operating only the minimum circuit for read training operation. In the description on each embodiment of the present invention, the data lines include a first data lines RGIO<0:7> and a second data lines RD_OUT<0:7>. The first data lines RGIO<0:7> are located between unit cells <0:7> and the training drivers 20 to 27. The second data lines RD_OUT<0:7> are located between the training drivers 20 to 27 and a data process unit.

When the training control signal RTRAIN is inactivated, the training drivers 20 to 27 transmit the transmitted data from the first data lines RGIC<0:7> to the second data lines RD_OUT<0:7 in the semiconductor memory device with a buffering operation. The training drivers 20 to 27 have two kinds of drivers. First training drivers DRIVER_0 are provided for transmitting low level signals ('0') of the data training pattern when the training control signal RTRAIN is activated and second training drivers DRIVER_1 are provided for transmitting high level signals ('1') of the data training pattern when the training control signal RTRAIN is activated.

As described above, the data training is to adjust the clock of the data processing unit based on an operating environment while the data are transmitted between the semiconductor memory device and the data processing unit. In case of a read training, the semiconductor memory device outputs a predetermined data training pattern to the data processing unit when a read command is issued from the semiconductor memory device to the data processing unit. At this time, the data training pattern is loaded on the second data lines RD_OUT<0:7> in the semiconductor memory device and it is outputted through a data output path for the read operation. The data processing unit to receive the predetermined data training pattern determines whether the clock is to lead or lag.

To carry out this training operation, the semiconductor memory device needs a circuit which loads the predetermined data training pattern on the second data lines RD_OUT<0:7> as shown in FIG. 2. At this time, if the data training pattern is already fixed so that there is no case where it is not changed, the training drivers 20 to 27 which are correspondent to the predetermined data training pattern can be connected to the second data lines RD_OUT<0:7> without storing the data training pattern or programming a change in the data training pattern in a circuit, such as a mode register set (MRS) in the semiconductor memory device. The training drivers 20 to 27 according to the present invention can apply to the second data lines RD_OUT<0:7> the data training pattern which is predetermined according to the training control signal RTRAIN. The training pattern which has the same number of bits as a pre-fetch is to be used in order to actually execute the data training operation. Accordingly, to meet this requirement, the training drivers 20 to 27 are connected to the second data lines RD_OUT<0:7>.

When the predetermined data training pattern is set to "11100010" at the read training operation, the fourth to sixth and eighth training drivers 23 to 25 and 27 which are connected to the fourth to sixth and eighth first data lines RGIO<3~5, 7>, respectively, are used as the first training drivers DRIVER_0 and the first to third and seventh training drivers 20 to 35 and 26 which are connected to the first to third and seventh first data lines RGIO<1~2, 6>), respectively, are used as the second training drivers DRIVER_1. That is, the connection between the first data lines RGIO<0:7> and the training drivers DRIVER_0 and DRIVER_1 is determined based on the data training pattern.

Hereinafter, the detailed operation of the training drivers DRIVER_0 and DRIVER_1 according to the present invention will be described on the assumption that the training control signal is activated to a high level.

Figure 3A:
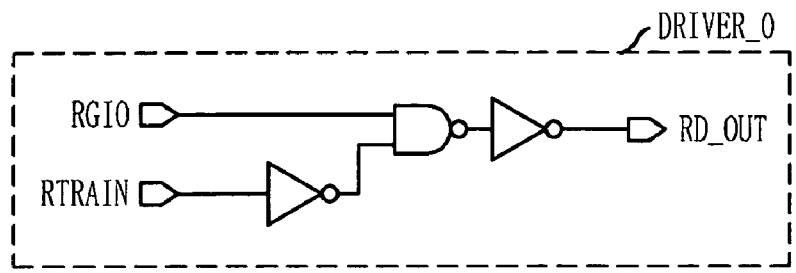
FIG. 3A is a schematic diagram illustrating a first training driver of FIG. 2.

FIG. 3A is a schematic diagram illustrating the first training driver DRIVER_0 of FIG. 2. Referring to FIG. 3A, the first training driver DRIVER_0 includes an inverter for inverting the training control signal RTRAIN, a NAND gate for NANDing an output signal of the inverter and the data transmitted from the first data line RGIO and an inverter for inverting an output of the NAND gate. Accordingly, when the training control signal RTRAIN is activated to a high level ('1'), the first training driver DRIVER_0 outputs the corresponding data training pattern, which is correspondent to a low level signal ('0'), to the second data line. On the contrary, when the training control signal RTRAIN is inactivated to a low level, the first training driver DRIVER_0 outputs the data transmitted from the first data line RGIO just through buffering operations.

Figure 3B:
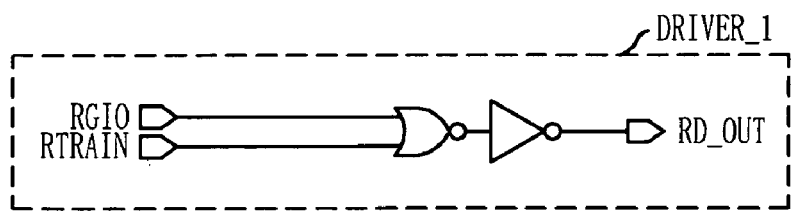
FIG. 3B is a schematic diagram illustrating a second training driver of FIG. 2.

FIG. 3B is a schematic diagram illustrating the second training driver DRIVER_1 of FIG. 2. Referring to FIG. 3B, the second training driver DRIVER_1 includes a NOR gate for NORing the training control signal RTRAIN and the data transmitted from the first data line RGIO and an inverter for inverting an output of the NOR gate.

Accordingly, when the training control signal RTRAIN is activated to a high level ('1'), the second training driver DRIVER_1 outputs the corresponding data training pattern, which is correspondent to a high level signal ('1'), to the second data line. On the contrary, when the training control signal RTRAIN is inactivated to a low level ('0'), the second training driver DRIVER_1 outputs the data transmitted from the first data line RGIO just through buffering operations.

As apparent from the above, in the semiconductor memory device according to the present invention, the delay time which is caused between the semiconductor memory device and the data processing unit can be verified by applying the data training pattern to the second data lines RD_OUT<0:7> in response to a request from the external data processing unit without using any operation of other control circuits and a register. Accordingly, the semiconductor memory device according to the present invention improves the reliability of the data transmission between the semiconductor memory device and the data processing unit.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
   a training driver configured to transmit one of data input from a first data line and a predetermined training data pattern to a second data line in response to a training control signal which is produced by decoding a read training command; and
   the second data line configured to transmit an output of the training driver,
   wherein the training driver transmits the predetermined training data pattern to the second data line during an activation period of the training control signal and transmits the data input from the first data line to the second data line during an inactivation period of the training control signal,
   wherein the training data pattern is logically fixed in the training driver and is generated in the training driver.

2. The semiconductor memory device of claim 1, wherein the training driver transmits a low level signal of the data training pattern to the second data line during the activation period of the training control signal.

3. The semiconductor memory device of claim 1, wherein the training control signal is activated to a high level.

4. The semiconductor memory device of claim 2, wherein the training driver includes:
   a first inverter for inverting the training control signal;
   a NAND gate for NAND operating an output signal of the first inverter and the data transmitted from the first data line; and
   a second inverter for inverting an output of the NAND gate.

5. The semiconductor memory device of claim 1, where in the training driver transmits high level signal of the data training pattern to the second data line during the activation period of the training control signal.

6. The semiconductor memory device of claim 1, wherein the first data line is coupled to the second data line through the training driver.

7. A semiconductor memory device comprising:
   a plurality of training drivers for transmitting a predetermined training data pattern to an plurality of I/O pads in response to an activation of a training control signal which is produced by decoding a read training command; and
   a plurality of first data lines for transmitting a data from a plurality of unit cells to the plurality of training drivers during a read operation and a write operation,
   wherein the plurality training drivers transmit the predetermined training data pattern to the second data line during an activation period of the training control signal and transmits the data to the second data line during an inactivation period of the training control signal,
   wherein the training data pattern is logically fixed in the plurality of training drivers and is generated in the plurality of training drivers.

8. The semiconductor memory device of claim 7, further comprising:
   a plurality of second data lines configured to transmit an output of the plurality of training drivers, each of the second data lines is coupled to each of the each of the training drivers,
   wherein the training drivers transmit a low level signal or a high level signal of the data training pattern to the second data lines during an activation period of the training control signal, wherein the predetermined training data pattern has a number of bits having the low level signals and the high level signals.

9. The semiconductor memory device of claim 8, wherein the training control signal is activated to a high level.

10. The semiconductor memory device of claim 9, wherein the training drivers include first training drivers for transmitting low level signals of the data training pattern during the activation period of the training control signal, the first training drivers include:
   a first inverter for inverting the training control signal transmitted from the corresponding first data line;

a NAND gate for NAND operating an output signal of the first inverter and the data transmitted from corresponding first data line; and a second inverter for inverting an output of the NAND gate.

11. The semiconductor memory device of claim 9, wherein the training drivers include second training drivers for transmitting high level signals of the data training pattern when the training control signal is activated, the second training drivers include:

a NOR gate for NOR operating the training control signal and the data transmitted from the corresponding first data line; and an inverter for inverting an output of the NOR gate.

12. A semiconductor memory device comprising:

training drivers for receiving data from first data lines and transmitting a predetermined data training pattern to second data lines during an activation period of a training control signal and the data received from the first data lines to the second data lines during an inactivation period of the training control signal, which is produced by decoding a read training command; and the second data lines for transmitting an output of the training drivers, wherein the training driver transmits the predetermined training data pattern to the second data line during an activation period of the training control signal and transmits the data received from the first data lines to the second data line during an inactivation period of the training control signal, wherein the training data pattern is logically fixed in the training drivers and is generated in the training drivers.

13. The semiconductor memory device of claim 12, wherein the training drivers include:

first training drivers for transmitting low level signals of the data training pattern to a low level data line of the second data lines during the activation period of the training control signal; and second training drivers for transmitting high level signals of the data training pattern to a high level data line of the second data lines during the activation period of the training control signal.

14. The semiconductor memory device of claim 13, wherein the training control signal is activated to a high level.

15. The semiconductor memory device of claim 14, wherein each of the first training drivers includes:

a first inverter for inverting the training control signal;

a NAND gate for NAND operating an output signal of the first inverter and the data transmitted from a unit cell; and a second inverter for inverting an output of the NAND gate.

16. The semiconductor memory device of claim 14, wherein each of the second training drivers includes:

a NOR gate for NOR operating the training control signal and the data transmitted from a unit cell; and an inverter for inverting an output of the NOR gate.

17. The semiconductor memory device of claim 5, wherein the training driver includes:

a NOR gate for NOR operating the training control signal and the data transmitted from the first data line; and an inverter for inverting an output of the NOR gate.

* * * * *